United States Patent
Chang

(10) Patent No.: US 9,253,896 B2
(45) Date of Patent: Feb. 2, 2016

(54) METHOD OF BONDING GLASS SUBSTRATE AND METAL SUBSTRATE

(71) Applicant: HON HAI PRECISION INDUSTRY CO., LTD., New Taipei (TW)

(72) Inventor: Jen-Tsorng Chang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 206 days.

(21) Appl. No.: 14/135,471

(22) Filed: Dec. 19, 2013

(65) Prior Publication Data

US 2015/0034240 A1 Feb. 5, 2015

(30) Foreign Application Priority Data

Aug. 2, 2013 (TW) .............................. 102127902 A

(51) Int. Cl.
B32B 37/06 (2006.01)
H05K 3/38 (2006.01)
B32B 17/06 (2006.01)
B32B 37/12 (2006.01)

(52) U.S. Cl.
CPC .............. H05K 3/382 (2013.01); B32B 17/061 (2013.01); B32B 2037/1238 (2013.01)

(58) Field of Classification Search
CPC ........ H05K 3/382; B32B 37/06; B32B 37/12; B32B 17/061
See application file for complete search history.

Primary Examiner — Daniel McNally
(74) Attorney, Agent, or Firm — Novak Druce Connolly Bove + Quigg LLP

(57) ABSTRACT

A bonding method for glass and metal requires a glass substrate and a metallic oxide film to be coated on a side of the glass substrate. A plurality of metallic oxide beads are impressed on a side of a metal substrate to be bonded. The glass substrate is placed on the metal substrate so the metallic oxide film makes contact with the metallic oxide beads, and the metallic oxide beads are heated to a melted state via a focusing laser, all the elements being pressed together at the same time and during slow cooling thereafter.

8 Claims, 2 Drawing Sheets

METHOD OF BONDING GLASS SUBSTRATE AND METAL SUBSTRATE

BACKGROUND

1. Technical Field

The present disclosure relates to bonding methods and, particularly to a method of bonding a glass substrate and a metal substrate.

2. Description of Related Art

Glass substrates are generally bonded to metal substrates with glue. However, the glue adhered between the glass substrate and the metal substrate ages mainly caused by exposure to light rays, which results in the bonding force of the glue degrading and the glass substrate may separate from the metal substrate.

Therefore, it is desirable to provide a bonding method that can overcome the limitations described.

DETAILED DESCRIPTION

Embodiments of the disclosure will be described with reference to the drawings.

Figure 1:
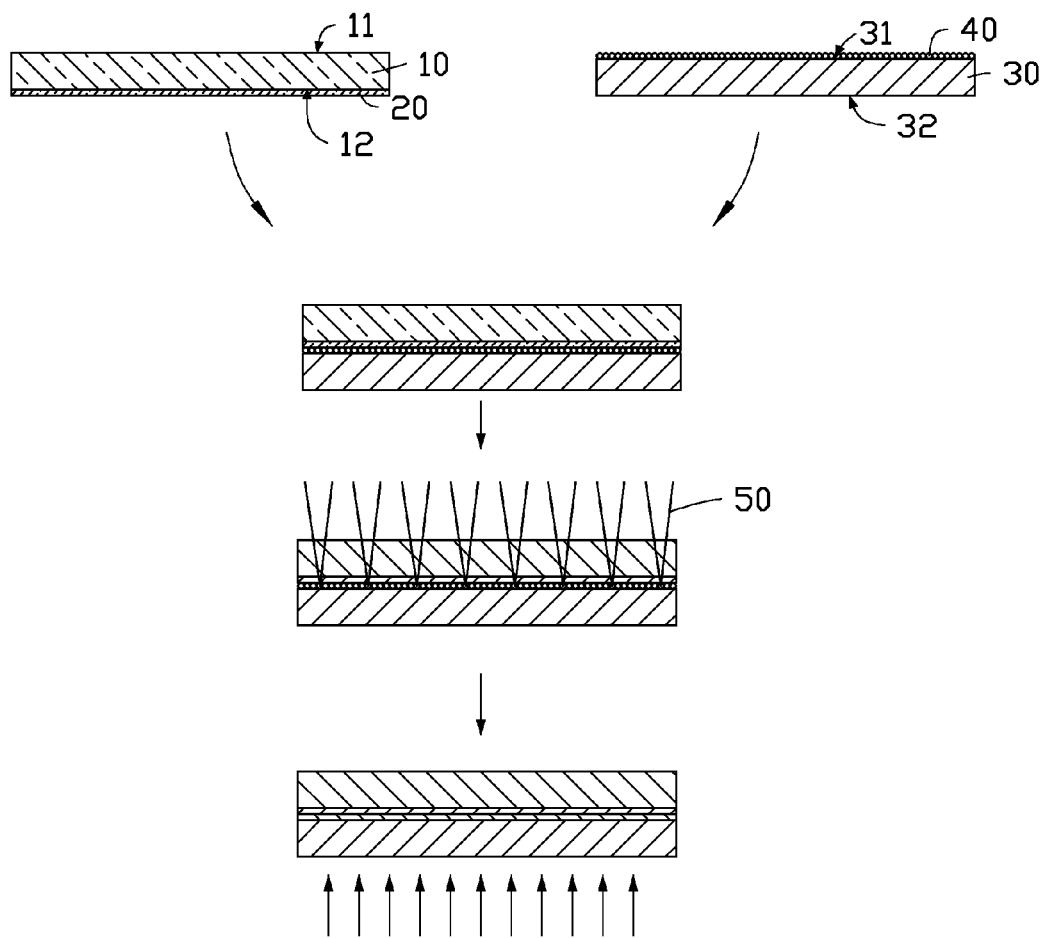
FIG. 1 is a pictorial flowchart of a method of bonding a glass substrate and a metal substrate in accordance with an exemplary embodiment.
Figure 2:
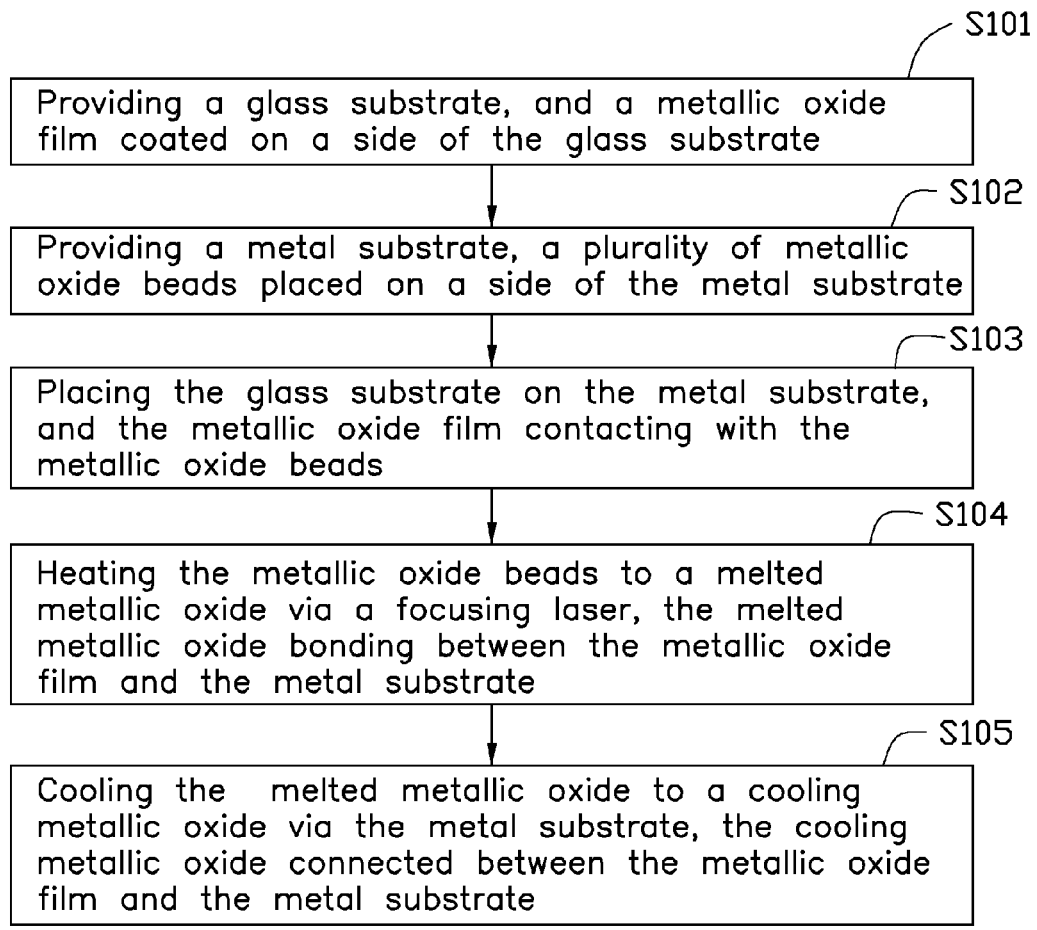
FIG. 2 is a block flowchart of the method of FIG. 1.

FIGS. 1-2 show a method of bonding a glass substrate 10 and a metal substrate 30 together according to an exemplary embodiment. The method includes steps of S101-S105.

In S101, the glass substrate 10 is provided, and a metallic oxide film 20 is coated on a side of the glass substrate 10.

The glass substrate 10 is made of sapphire, and includes an upper surface 11 and a lower surface 12 opposite to the upper surface 11. The glass substrate 10 is placed in a coating machine (not shown), the lower surface 12 faces a target element (not shown) received in the coating machine. The metallic oxide film 20 can be an aluminum oxide ($Al_2O_3$) film, a magnesium oxide (MgO) film, or a copper oxide (CuO) film.

In S102, the metal substrate 30 is provided, a number of metallic oxide beads 40 are placed on the metal substrate 30.

The metal substrate 30 includes a top surface 31 and a bottom surface 32 opposite to the top surface 31. The metallic oxide beads 40 are bombarded onto the top surface 31 by a bombarding device (not shown). A diameter of each metallic oxide bead 40 is greater than about 1 um and less than about 100 um. The metal substrate 30 is made of aluminum, magnesium, or copper. The metallic oxide bead 40 can be an $Al_2O_3$ bead, a MgO bead, or a CuO bead. The metallic oxide bead 40 and the metallic oxide film 20 can be made of same or different metallic oxide materials. A metal of the metal substrate 30 can be the same as or different to a basic metal of the metallic oxide material.

In the embodiment, the metallic oxide beads 40 and the metallic oxide film 20 are made of the same metallic oxide materials. The basic metal of the metallic oxide material is the same as the metal of the metal substrate 30. The metallic oxide film 20 is the $Al_2O_3$ film. The metal substrate 30 is made of Al. The metallic oxide beads 40 are the $Al_2O_3$ beads.

In S103, the glass substrate 10 coated with the metallic oxide film 20 is placed on the metal substrate 30, and the metallic oxide film 20 is open to contact with the metallic oxide beads 40.

The metallic oxide film 20 completely contacts with the metallic oxide beads 40. The lower surface 12 of the glass substrate 10 faces the top surface 31 of the metal substrate 30. The lower surface 12 is parallel with the top surface 31.

In 5104, a focusing laser 50 passes through the glass substrate 10 to heat the metallic oxide beads 40, and the glass substrate 10 is pressed to the metal substrate 30 at the same time. The metallic oxide beads 40 are heated to a melted metallic oxide under the focusing laser 50, and the melted metallic oxide bonds between the metallic oxide film 20 and the metal substrate 30.

A laser source emitting the focusing laser 50 is placed at a side adjacent to the glass substrate 10. The focusing laser 50 passes through the glass substrate 10 and focuses on the metallic oxide beads 40, therefore the metallic oxide beads 40 will be heated quickly, and the glass substrate 10 will not be subjected to much heating. During process of heating the metallic oxide beads 40, the glass substrate 10, and the metal substrate 30 are uniformly compressed by a pressing device (not shown). The metal metallic oxide uniformly flows between the metallic oxide film 20 and the metal substrate 30.

In S105, the melted metallic oxide is cooled to a cooling metallic oxide via the metal substrate 30, the cooling metallic oxide thus connects the metallic oxide film 20 and the metal substrate 30.

The metal substrate 30 is placed adjacent to a cooling device (not shown) after the melted metallic oxide completely fills any gap between the metallic oxide film 20 and the metal substrate 30. A temperature is gradually decreased, avoiding cracking or breaking of the glass substrate 10.

As the glass substrate 10 connects the metal substrate 30 with the metallic oxide film 20 and the cooling metallic oxide, the metallic oxide will not age under light ray irradiation, and the stability and bond strength of the glass substrate 10 and the metal substrate 30 is increased.

Particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A bonding method, comprising:
   providing a glass substrate, with a metallic oxide film coated on a side of the glass substrate;
   providing a metal substrate, with a plurality of metallic oxide beads placed on a side of the metal substrate;
   placing the glass substrate on the metal substrate, with the metallic oxide film contacting with the metallic oxide beads; and
   heating the metallic oxide beads to a melted metallic oxide via a focusing laser, such that the melted metallic oxide bonds the metallic oxide film and the metal substrate together.

2. The bonding method of claim 1, wherein the metallic oxide bead and the metallic oxide film are made of same metallic oxide materials.

3. The bonding method of claim 2, wherein a basic metal of the metallic oxide materials is the same as a metal of the metal substrate.

4. The bonding method of claim 3, wherein the metallic oxide film is a $Al_2O_3$ film, and the metal substrate is made of Al, and the metallic oxide beads are $Al_2O_3$ beads.

5. The bonding method of claim 1, wherein a diameter of each metallic oxide bead is greater than about 1 um and less than about 100 um.

6. The bonding method of claim 1, wherein the glass substrate is made of sapphire.

7. The bonding method of claim 1, wherein the glass substrate and the metal substrate are compressed together during heating the metallic oxide beads to the melted metallic oxide via the focusing laser.

8. The bonding method of claim 1, comprising a step of cooling the melted metallic oxide to a cooling metallic oxide via the metal substrate, such that the cooling metallic oxide is connected between the metallic oxide film and the metal substrate.

\* \* \* \* \*